United States Patent
Chung et al.

(10) Patent No.: US 8,183,910 B2
(45) Date of Patent: May 22, 2012

(54) CIRCUIT AND METHOD FOR A DIGITAL PROCESS MONITOR

(75) Inventors: Shine Chung, Taipei (TW); Fu-Lung Hsueh, Cranberry, NJ (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 103 days.

(21) Appl. No.: 12/495,024

(22) Filed: Jun. 30, 2009

(65) Prior Publication Data
US 2010/0123483 A1 May 20, 2010

Related U.S. Application Data

(60) Provisional application No. 61/115,391, filed on Nov. 17, 2008.

(51) Int. Cl.
*H01L 35/00* (2006.01)
*H01L 37/00* (2006.01)
*H03K 3/42* (2006.01)
*H03K 17/78* (2006.01)

(52) U.S. Cl. ...................................... 327/512
(58) Field of Classification Search ........... 327/512–513
See application file for complete search history.

(56) References Cited

U.S. PATENT DOCUMENTS

| | | | | |
|---|---|---|---|---|
| 5,592,111 A * | 1/1997 | Wong et al. | ...................... | 327/45 |
| 5,859,560 A * | 1/1999 | Matthews | ...................... | 327/513 |
| 6,882,213 B2 * | 4/2005 | Kim | .............. | 327/512 |
| 7,549,795 B2 * | 6/2009 | Kosta et al. | .................... | 374/170 |
| 2005/0068214 A1* | 3/2005 | Kim | .............. | 341/144 |
| 2006/0138582 A1* | 6/2006 | Han et al. | ...................... | 257/467 |
| 2006/0267668 A1* | 11/2006 | Porter | ........................ | 327/512 |
| 2007/0280330 A1* | 12/2007 | Jeong et al. | ................... | 374/141 |
| 2008/0054935 A1 | 3/2008 | Pan | | |

* cited by examiner

*Primary Examiner* — Quan Tra
(74) *Attorney, Agent, or Firm* — Slater & Matsil, L.L.P.

(57) ABSTRACT

A circuit and method for a digital process monitor is disclosed. Circuits for comparing a current or voltage to a current or voltage corresponding to a device having process dependent circuit characteristics are disclosed, having converters for converting current or voltage measurements proportional to the process dependent circuit characteristic to a digital signal and outputting the digital signal for monitoring. The process dependent circuit characteristics may be selected from transistor threshold voltage, transistor saturation current, and temperature dependent quantities. Calibration is performed using digital techniques such as digital filtering and digital signal processing. The digital process monitor circuit may be formed as a scribe line circuit for wafer characterization or placed in an integrated circuit die as a macro. The process monitor circuit may be accessed using probe pads or scan test circuitry. Methods for monitoring process dependent characteristics using digital outputs are disclosed.

22 Claims, 9 Drawing Sheets

CIRCUIT AND METHOD FOR A DIGITAL PROCESS MONITOR

This application claims the benefit of U.S. Provisional Application No. 61/115,391, entitled "Circuit and Method for a Digital Process Monitor," filed on Nov. 17, 2008, which is incorporated herein by reference.

TECHNICAL FIELD

The present invention relates to a circuit and method for providing an improved digital process monitor circuit and method for use in semiconductor circuits. Data indicative of process performance for a complete semiconductor based circuit, either in wafer form or in die form, such as readings related to temperature sensitivity, is typically collected at a tester or probe station. The present invention is directed to providing an improved process monitor circuit and method that effectively provide digital outputs indicating the characteristics of a manufactured device, a semiconductor wafer, a semiconductor die, or an integrated circuit, with an efficient testing method.

BACKGROUND

Highly integrated semiconductor circuits are increasingly important, particularly in producing battery operated devices such as cell phones, portable computers such as laptops, notebook computers and PDAs, wireless email terminals, MP3 audio and video players, portable wireless web browsers and the like, and these sophisticated integrated circuits increasingly include on-board data storage.

As is known in the art, process variations that occur during manufacture of the semiconductor substrates result in different characteristics for devices on different wafers, or for devices on different portions of the same wafer. Of particular interest to the qualification of parts made using semiconductor substrates are characteristics that relate to temperature sensitivity or temperature dependent properties. So called "process corner analysis" may rate a wafer or dies obtained from a lot by determining from certain process dependent characteristics that are monitored by test equipment, and the results indicating whether the devices are fast, slow, and more or less sensitive to temperature variations, etc.

For example, threshold voltages of transistors on the wafer may be an important, temperature dependent characteristic. Another measure often considered is the current through MOS devices in saturation, typically referred to as $I_{DSAT}$. This current may also vary with process variations, so in order to determine whether a particular device manufactured on a semiconductor substrate meets the quality criteria established for these parameters, testing is usually performed on the wafer, on individual dies, or on a packaged integrated circuit to observe these characteristics.

Temperature on the semiconductor device is another important measure. When temperature dependent characteristics are measured, the absolute temperature on the semiconductor device is of interest. In the prior art, a thermal sensor using, for example, a proportional to absolute temperature (PTAT) circuit element may be provided on an integrated circuit, or in a scribe line on a semiconductor wafer. It is also known to perform an analog to digital conversion of the resulting current/voltage and output a digital signal that has a known correspondence to the analog temperature value of interest. However, the need for increasing ease and speed in measuring the process dependent characteristics of a completed device, as well as the need for performing these measures in the digital domain to increase efficient use of valuable tester time, thereby improving throughput, remains. A fast and easily accessible readout of important measured process dependent performance characteristics to enable process corner determinations for wafers or individual integrated circuits or dies, without the need for complex test equipment, is needed.

Thus, there is a continuing need for an efficient and effective process monitor circuit and process monitor methods that provide reliable and easy to use outputs for various device characteristics associated with semiconductor process variations without the need for extensive testing or large numbers of wafer or circuit probes.

SUMMARY OF THE INVENTION

These and other problems are generally solved or circumvented, and technical advantages are generally achieved, by embodiments of the present invention, which provides circuits and methods to improve the operation of process monitor circuitry and the digital output circuits used with the process monitor circuits.

In one exemplary embodiment, a process monitor circuit for outputting a digital signal corresponding to the threshold voltage characteristic Vtn for a device is provided. In another exemplary embodiment, the above described embodiment further comprises a comparator circuit that compares a charging capacitor voltage to the threshold voltage and outputs a ramp signal on a periodic basis as the capacitor is charged and discharged. In another preferred embodiment, a voltage to time converter circuit further converts the ramped signal to a periodic signal with a frequency corresponding to the threshold voltage. In another preferred embodiment, the periodic signal is converted to a digital output signal corresponding to the threshold voltage.

In another preferred embodiment, a process monitor circuit for outing a digital signal corresponding to the saturation current for transistors for a semiconductor device is provided. In another exemplary embodiment, the saturation current process monitor circuit is provided, comprising a comparator circuit that compares a Vdd signal to a voltage of a transistor in saturation and outputs a current proportional to the saturation current. In another preferred embodiment, the current is converted to a voltage. In another preferred embodiment, the voltage is converted to a digital signal that is output.

In another preferred embodiment, a process monitor circuit is provided that outputs a digital signal proportional to a temperature dependent quantity. In another preferred embodiment, the process monitor circuit that outputs the temperature dependent quantity further comprises a comparator that compares a voltage corresponding to a bias current input into a diode to a voltage corresponding to a bias current input into a resistor having a temperature dependent value, and outputs a current corresponding to the temperature to a converter that outputs a digital signal.

In another preferred embodiment, a device under test circuit is provided on a semiconductor wafer that has a selection circuit coupled to receive and output signals corresponding to a voltage threshold circuit parameter, a transistor saturation current circuit parameter, a temperature dependent quantity, and a converter for converting the output to a digital signal. In another preferred embodiment, the above described device under test circuit is provided in a scribe line area. In another preferred embodiment, the device under test circuit further comprises a probe pad coupled to output the digital signal. In another preferred embodiment, the device under test circuit further comprises a digital calibration circuit. In another preferred embodiment, the digital calibration circuit further comprises a digital filter.

In another preferred embodiment, an integrated circuit is provided having a test macro circuit, the test macro circuit comprising a selection circuit coupled to receive and output signals corresponding to a voltage threshold circuit parameter, a transistor saturation current circuit parameter, a temperature dependent quantity, and a converter for converting the output to a digital signal. In another preferred embodiment, the above described device under test circuit is provided in a scribe line area. In another preferred embodiment, the device under test circuit further comprises a probe pad coupled to output the digital signal. In another preferred embodiment, the device under test circuit further comprises a digital calibration circuit. In another preferred embodiment, the digital calibration circuit further comprises a digital filter.

In another preferred embodiment, an integrated circuit is provided, comprising a process monitor circuit for outputting a digital signal corresponding to the threshold voltage characteristic Vtn for a device. In another exemplary embodiment, the above described embodiment further comprises a comparator circuit that compares a charging capacitor voltage to the threshold voltage and outputs a ramp signal on a periodic basis as the capacitor is charged and discharged. In another preferred embodiment, a voltage to time converter circuit further converts the ramped signal to a periodic signal with a frequency corresponding to the threshold voltage. In another preferred embodiment, the periodic signal is converted to a digital output signal corresponding to the threshold voltage.

In another preferred embodiment, the integrated circuit process monitor circuit further comprises a circuit for outputting a digital signal corresponding to the saturation current for transistors. In another exemplary embodiment, the saturation current process monitor circuit is provided, comprising a comparator circuit that compares a Vdd signal to a voltage of a transistor in saturation and outputs a current proportional to the saturation current. In another preferred embodiment, the current is converted to a voltage. In another preferred embodiment, the voltage is converted to a digital signal that is output.

In another preferred embodiment, the above described integrated circuit has a process monitor circuit that outputs a digital signal proportional to a temperature dependent quantity. In another preferred embodiment, the process monitor circuit that outputs the temperature dependent quantity further comprises a comparator that compares a voltage corresponding to a bias current input into a diode to a voltage corresponding to a bias current input into a resistor having a temperature dependent value, and outputs a current corresponding to the temperature to a converter that outputs a digital signal.

A method embodiment for monitoring a semiconductor process is provided, comprising providing a temperature independent reference current; comparing a voltage at a node corresponding to a bias current coupled to a reference circuit element to a voltage at a node corresponding to a bias current coupled to a circuit element having a semiconductor process characteristic to be measured and outputting a current corresponding to the measured process characteristic; converting the process characteristic to a digital signal; and outputting the digital signal; wherein the measured process characteristic is one taken from the group of a transistor threshold voltage, a transistor saturation current, a temperature dependent quantity, and a combination of these.

The foregoing has outlined rather broadly the features and technical advantages of the present invention so that the detailed description of the invention that follows may be better understood. Additional features and advantages of the invention will be described hereinafter, which form the subject of the claims of the invention. It should be appreciated by those skilled in the art that the conception and specific embodiment disclosed might be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

The drawings, schematics and diagrams are illustrative and not intended to be limiting, but are examples of embodiments of the invention, are simplified for explanatory purposes, and are not drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
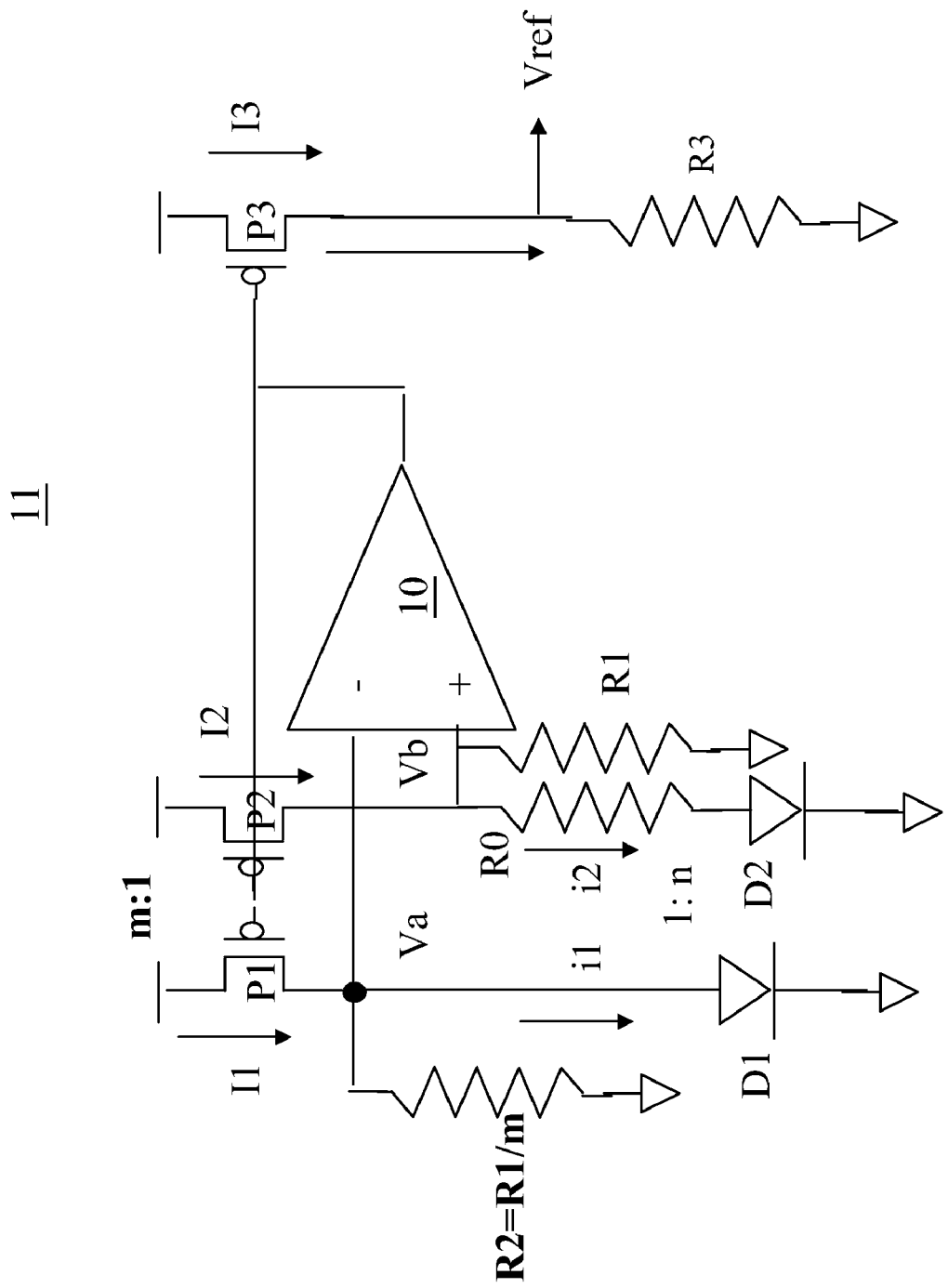
FIG. 1 illustrates a simplified circuit diagram for a prior art bandgap reference circuit.

FIG. 1 depicts in a circuit diagram a prior art bandgap reference. Importantly, this bandgap reference circuit outputs a current I2 which is independent of temperature, that is, the current has no thermal dependency. The current mirror transistor P3 and the resistor R3 can convert the output current I2 to a voltage reference which is also, to a first order, independent of temperature. These references are needed for embodiments of the invention as will be described in detail below.

In FIG. 1, an operational amplifier 10 is used in a feedback configuration. As is known in the art, a virtual ground exists between the inputs in an operational amplifier when it is configured in this manner. Thus, Va is equal to Vb and simple current and voltage relationships may be used to express the current I2.

$$I2=V(R0)/R0+(V(R0)+Vd2)/R1=kT/q*\ln(n*m)*(1/R0+1/R1)+Vd2/R1$$

As can be seen by examining the final form of the relationship above, the first term kT/q has a positive temperature coefficient of about 26 millivolts/300° C. The term Vd2 has a temperature coefficient of about −1.5 millivolts/° C. By choosing the values for R0 and R1, the term ln(n*m)*(R1/R0+1) may be made equal to 1.5 millivolts*300/26 millivolts, the temperature dependent terms for I2 can be cancelled and thus I2 has a zero temperature coefficient.

This is known in the art and bandgap references are often used to provide a constant current source that is temperature independent.

The bias circuits P1, P2, R0, R1, and diode D1 provide bias for the operational amplifier 10. The current mirror of transistor P3 and resistor R3 simply converts the constant current I2 to a voltage Vref. Because R0, R1, and R2 have some process variations, the bias circuit needs to be adjusted slightly to generate the zero temperature coefficient voltage Vref. Using circuit simulation tools, the circuit can be adjusted to provide Vref free of temperature dependence. Thus, the circuit may be configured to provide either current or voltage references free of temperature dependence.

Figure 2:
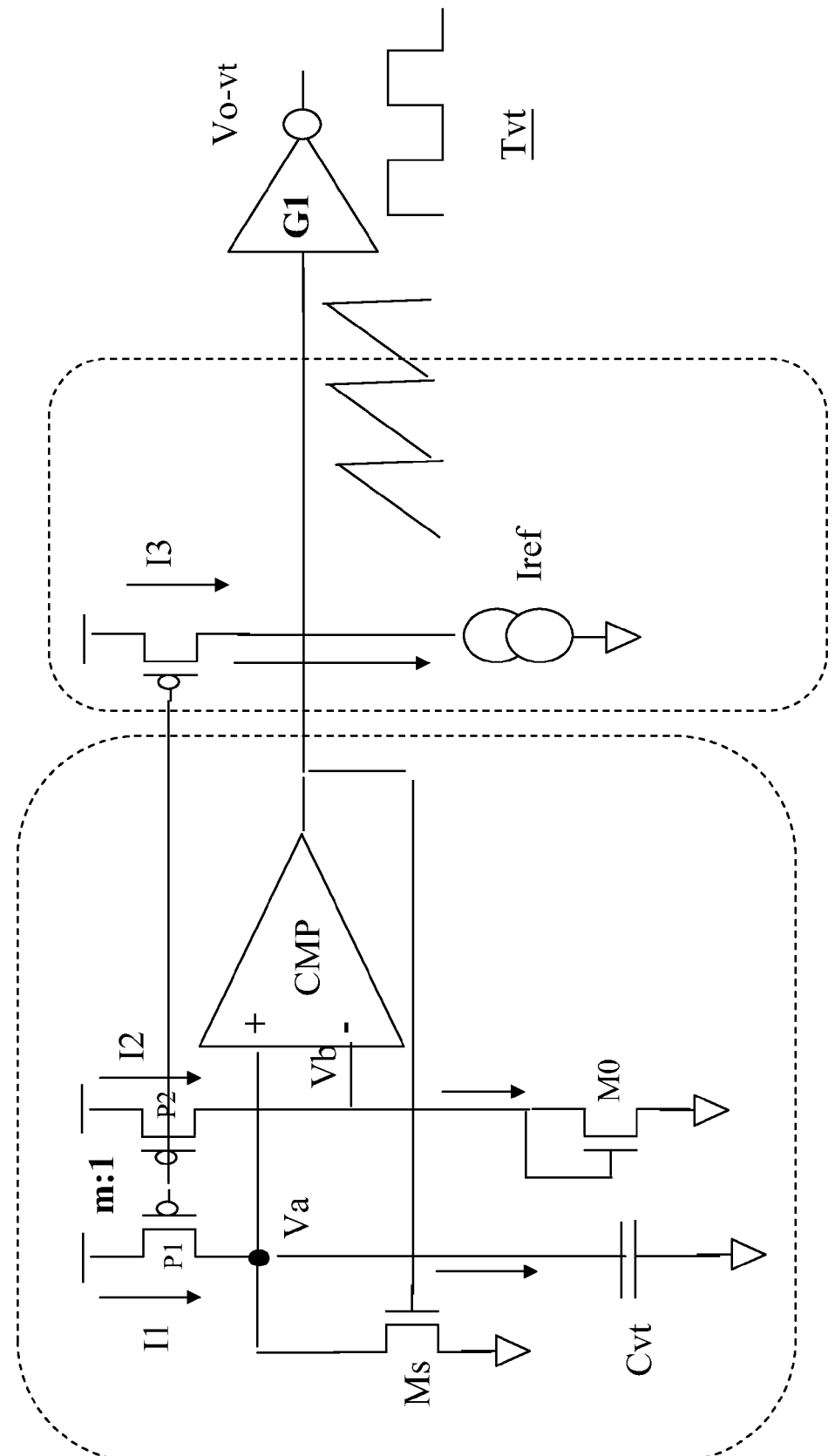
FIG. 2 illustrates a circuit diagram for an exemplary transistor threshold voltage measuring circuit embodiment of the present invention.

One critical process dependent characteristic typically used to objectively determine process and circuit performance is the transistor threshold voltage, Vtn. FIG. 2 depicts a circuit embodiment of the present invention directed to a measurement of Vtn and to a voltage to time converter circuit as the output.

In FIG. 2, a circuit configured around an operational amplifier 10 is again formed in a manner similar to, but different from, the bandgap reference circuit of FIG. 1. In FIG. 2, operational amplifier 10 compares the voltages at Va and Vb. The feedback output becomes high, or true, when the voltage at the −terminal Va exceeds the voltage Vb, which is the threshold voltage for transistor M0, since it is configured as a diode connected transistor. When the current I1 charges the capacitor Cvt to the voltage Vb, the comparator 10 labeled CMP will output a high voltage and discharge the capacitor through the transistor Ms to ground. Once the capacitor Cvt discharges, the cycle begins again. The current Iref, for instance from the bandgap reference, sets the current I2 into the transistor M0 and may be, for example, around 1-10 microamp. The threshold voltage Vtn is around 400-700 mV.

The cycling measurement of Vtn by the comparator CMP will output a ramp waveform signal that forms a sawtooth, as shown in the figure. The inverter G1, by virtue of the transistors within it, then forms a square wave output. Thus, the voltage Vtn is converted to a time measurement in the form of a periodic square wave signal with period Tvt=Vtn*Cvt/I1. Again, current I1 is set by the sizes of the current source transistors P1, P2, and current source Iref=I3 is used in the current mirror to bias the circuit. Thus, the time signal is related to the desired measure Vtn by a well known correspondence and the time varying signal Vo can be used to measure Vtn.

Figure 3:
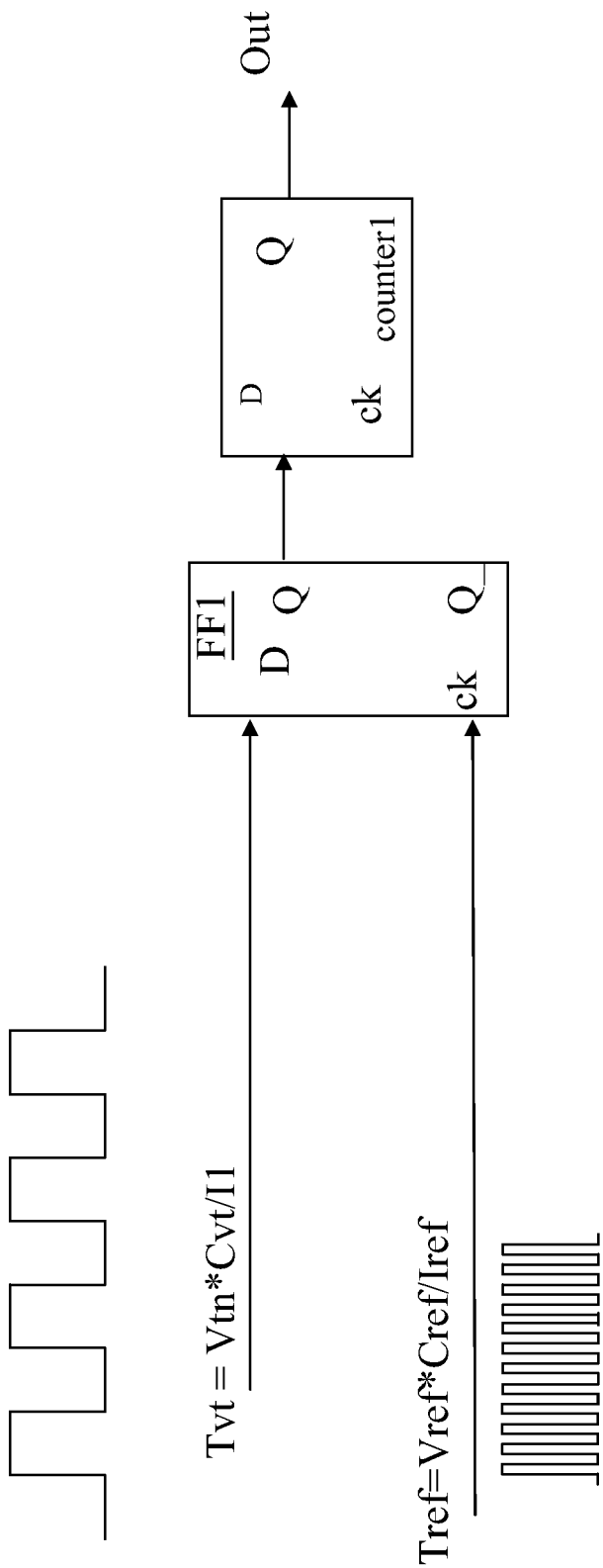
FIG. 3 illustrates a circuit diagram of an exemplary digital converter circuit embodiment of the present invention.

FIG. 3 depicts a simple circuit for providing a digital readout of the time measurement Tvt. As is well known, a time varying signal may be sampled by a much faster signal by clocking a register. A sample of the signal taken over time may be measured by counting the samples for some number of clocks. FIG. 3 presents a simple circuit for sampling the time signal Tvt. A faster clock, supplied from an external input or alternatively, generated internally by an RC circuit such as Tref=Vref*Cref/Iref, is used in FIG. 3 to clock the Tvt signal and count the number of cycles. This is a simple time-to-digital converter. In general, FIG. 2 and FIG. 3 combined illustrate a simple way to convert saturation current of M0 to a digital measurement through the use of a current-to-time and time-to-digital circuit. There are many embodiments of such current to digital conversions.

A faster reference clock is provided, for example, by using a time signal Tref developed with a reference capacitor Cref. By selecting the value of Cref, the frequency of the clock signal can exceed the Nyquist required sampling rate needed to sample Tvt by a sufficient frequency to provide a good output without aliasing problems, as is known in the art. Register FF1 samples the signal Tvt when clocked and the samples are accumulated by a counter over a period of time. Thus, the output is a digital weight with a known correspondence to the threshold voltage Tvt.

The output of the converter may provide the resolution required, for example, 10 bits or 12 bits. More or less resolution can be provided and the sampling frequency may be increased or decreased as a design choice for a particular application.

Providing a digital measure of the quantity measured by the process monitor circuit has many advantages over a simple probing of an analog signal, as conventionally done. No dedicated probe pad is needed to perform the test, as the output register (counter 1) may be placed in a scan chain or built in self test (BIST) circuit and read through interfaces that are usually already present for integrated circuits. Digital readout can be used for self-adjusting circuit performance. Any compensation or calibration needed may be done in the tester using digital filtering techniques, as will be described in greater detail below, and no tuning or trimming is required to compensate for known second and third order effects. The measurement is simple and may be performed very quickly, improving throughput by lowering test time.

Those skilled in the art will recognize that the output of the comparator CMP in FIG. 2 has been converted by the digital sampling circuitry of FIG. 3 to a digital signal Out. Of course, the signal may be converted to digital form using other known analog to digital converters (ADC); most typically, a sigma delta or delta sigma ADC could be used. The use of the register and counter of FIG. 3 is but one exemplary embodiment of a digitizer and does not limit the embodiments or the scope of the invention as recited in the appended claims, but provides one simple embodiment for providing the digital output signal.

Figure 4:
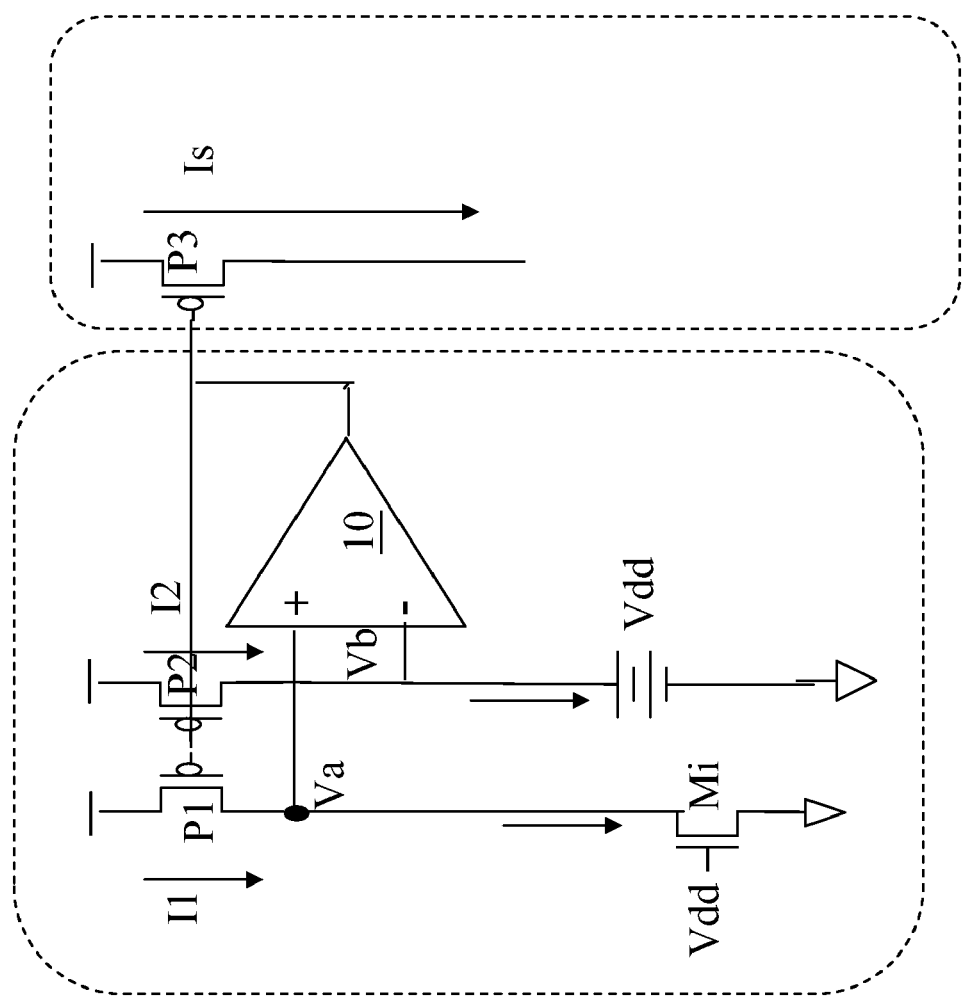
FIG. 4 illustrates a circuit diagram of an exemplary transistor saturation current measurement circuit embodiment of the present invention.

FIG. 4 depicts in a circuit diagram another embodiment of a process monitor circuit 41 arranged around comparator 10 in feedback configuration. The saturation current Idsat through a transistor is measured as a process monitor. In FIG. 4, transistors P1 and P2 again provide currents I1 and I2 into the circuit. Voltages Va and Vb are coupled to the virtual ground at the input of the operational amplifier 10. In this example, voltage Vdd is placed at Vb, so Va therefore will be made to equal Vdd. Thus, the transistor Mi will be in saturation as Vds=Vgs=Vdd, as seen in the figure. Transistor Mi will then sink a saturation current I1 which, by virtue of the current mirror transistor P3, is output as a current Is.

From the discussions above, it is known how to convert this current into a voltage, and to convert the analog measure (current or voltage) to a digital quantity. In this manner the process monitor circuit 41 can provide a digital output signal corresponding to the current Idsat.

Figure 5:
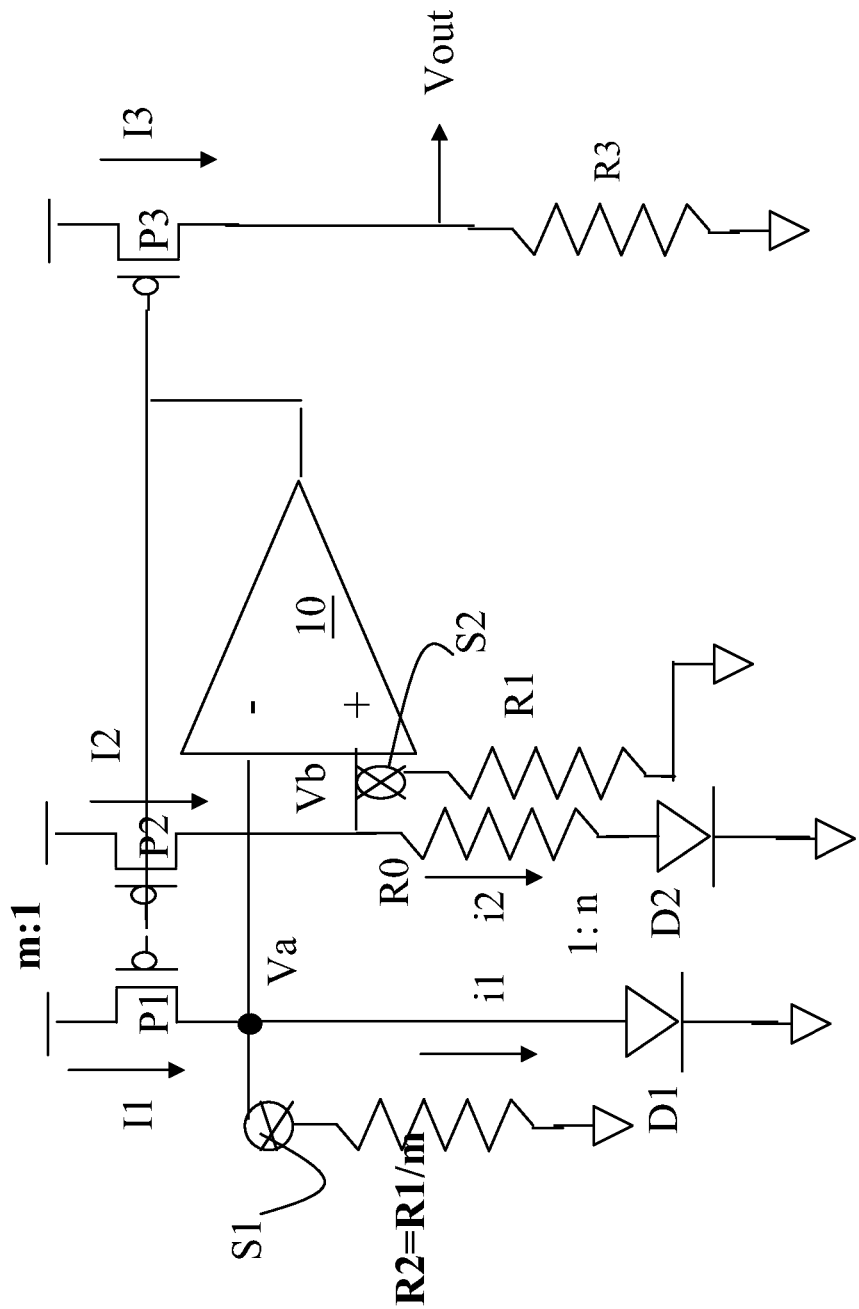
FIG. 5 illustrates a circuit diagram of an exemplary temperature dependent quantity measurement circuit embodiment of the present invention.

FIG. 5 depicts a temperature monitor circuit 51, which is based on a simple modification to the bandgap reference of FIG. 1. Examining FIG. 5, note that the circuit of FIG. 1 is duplicated with the addition of two switches S1 and S2. In describing the current I2 (which equals the integer-multiple of current I3, by virtue of the current mirror), the equations for I2 provided above illustrate how the temperature dependence of the circuit may be removed by taking advantage of the relationship between R0 and R1 to cancel dependent terms. It follows then that by cutting out the R1 resistors from the bandgap reference circuit of FIG. 1 using these added switches S1 and S2, the output current I3 will be temperature dependent. Thus, a circuit with an output proportional to absolute temperature (PTAT) is formed. This current can be provided in voltage format simply by a current to voltage converter of P3 and R3 as before.

The benefits of using the switches S1 and S2 to form the PTAT circuit of FIG. 5 further suggest that additional arrangements may be used as alternative embodiments. Instead of providing a dedicated PTAT circuit, the PTAT circuit and the bandgap reference circuit used to form the Iref and Vref quantities needed for the process monitor circuitry may be shared. That is, using a single circuit, when a PTAT measurement is made, the switches S1 and S2 are opened. This measurement is quick and because the bandgap reference output is a slowly changing signal, by quickly switching the circuit back to the Vref configuration (closing S1 and S2 to form the connections to R1 and R2), these components need not be built twice but only once, reducing circuit complexity and minimizing the circuit area required.

Further, examination of each of the process monitor circuits in FIGS. 2, 4 and 5 suggests that the same operational amplifier 10 may be used for each of these circuits in additional alternative embodiments by using selection switches and control logic to determine the function of the operational amplifier circuit at a given moment in time. In this manner, the number of operational amplifiers needed to form a multiple output process monitor circuit may be reduced from four (one each for the bandgap reference, for Vtn, one Idsat, and one for PTAT) to one. The area and circuit complexity savings by using one operational amplifier, versus four, is substantial. However, additional control circuitry is needed for this alternative embodiment approach, and a straightforward design approach of providing each process monitor circuit as a stand alone circuit including an individual operational amplifier as a comparator is therefore also an exemplary embodiment.

Figure 6:
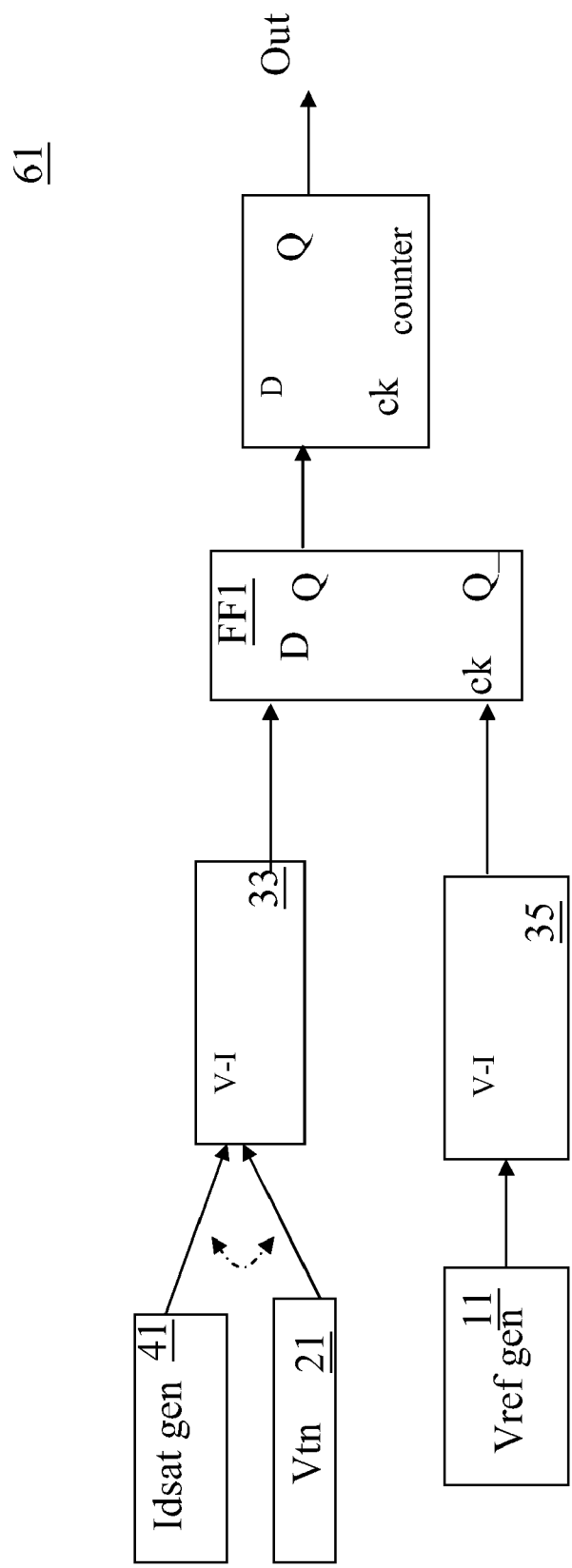
FIG. 6 illustrates in a simplified block diagram an exemplary process monitor circuit embodiment of the present invention.

The embodiments above provide a circuit for each of the commonly used process monitor characteristic measures, Vtn, Idsat, and absolute temperature. The embodiments are also adapted to provide digital outputs. FIG. 6 depicts a block diagram of a circuit embodiment 61 for forming a complete process monitor circuit for use in a semiconductor wafer, for instance by placing the circuit in the scribe line area, or alternatively by providing the process monitor as a macro formed on each integrated circuit die. If the circuit is placed in the scribe line area, the output could be probed at a probe pad as known in the art. If the circuit is a macro within an integrated circuit, a probe pad could be provided, a multiple function input/output pin could be used, or a scan chain or BIST circuit could be used to access the output without using any probe pads or added pins; also as known in the art.

In FIG. 6, the Idsat circuit 41 may be coupled to the voltage to time or current to time converter 33. As described above, a clock output may be derived from the Vref generator 11, and that clock output is fed to a flip flop FF1. Alternatively, the Vtn circuit 21 could be coupled by a selection switch to the V-T converter 33 and then to FF1. The counter then receives the output of the flip flop and forms a digital signal corresponding to the current Idsat, the voltage Vtn, or if the circuit of FIG. 5 is also used, a digital signal corresponding to temperature on the semiconductor device. V-T converter 35 generates a clock signal to the register FF1.

Figure 7:
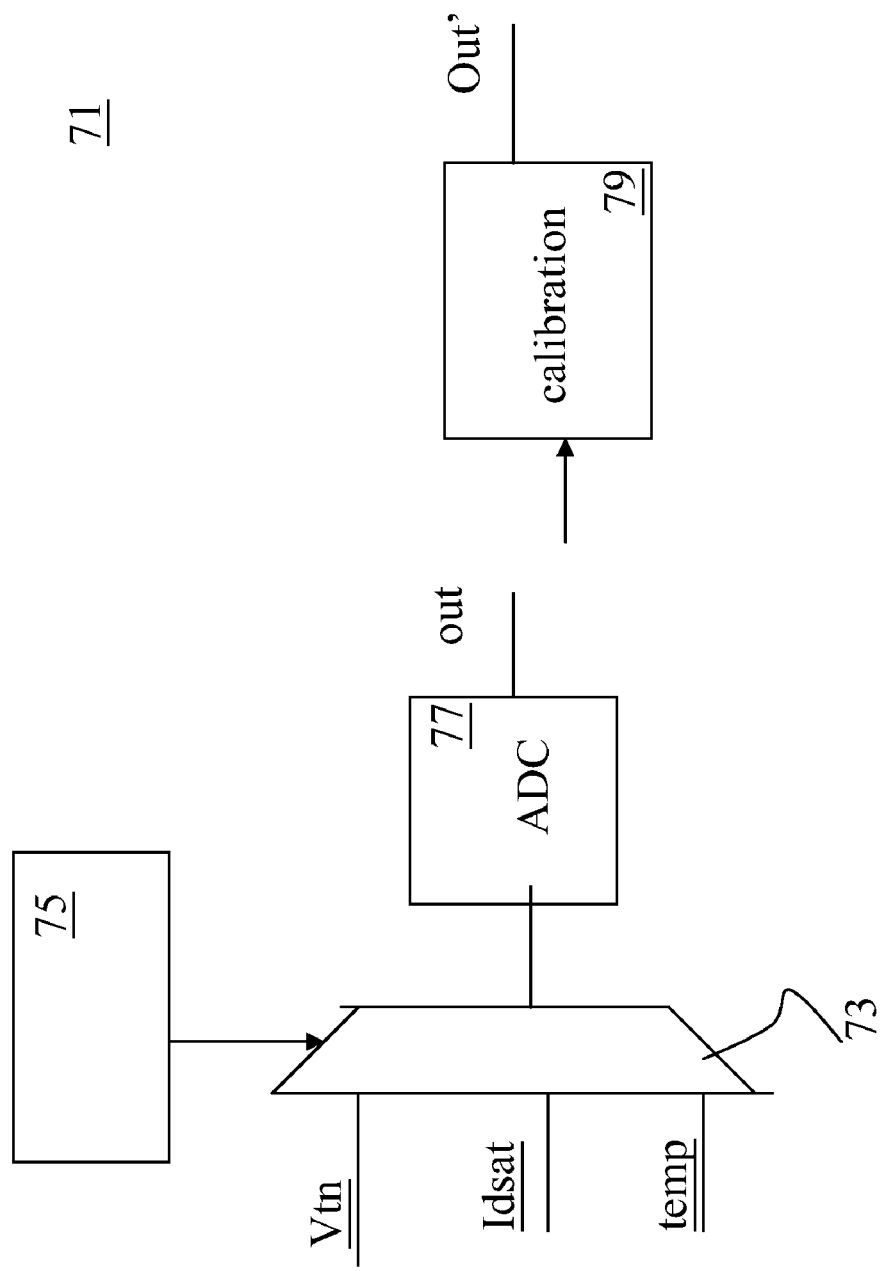
FIG. 7 illustrates an alternative arrangement process monitor circuit embodiment of the present invention.

FIG. 7 depicts an exemplary output circuit 71 for an alternative embodiment process monitor circuit. In FIG. 7, a multiplexer or other selection circuit 73 is provided. Control circuitry 75 will cause the multiplexer to select a signal that is indicative of a process dependent measured signal, for example Vtn, Idsat or a signal proportional to temperature, as described above. An analog to digital converter ADC 77 then converts the selected signal to a digital signal, which is then output.

An additional block 79 labeled "calibration" is shown in FIG. 7. The use of a digital readout signal for the measured quantities enables additional benefits in calibration. In contrast to prior art approaches, calibration of the process monitor circuit by complex tuning or trimming physical components is not needed in the exemplary embodiments. Instead, the digital output can be compensated using, for example, digital filtering techniques. The digital filter can be performed in hardware or in software, or using a programmable device such as a DSP. The calibration block 79 may be part of the process monitor circuit, or in additional embodiments, it may be implemented as software or hardware provided in test equipment or a probe card. By performing the calibration at the test equipment, the circuitry required in the process monitor circuit embodiments can be simplified and thus, area needed and circuit design time is reduced.

The calibration can account for known or observed second order effects. An expression for one possible calibration is:

$$Q'(\text{Idsat}) = Q(\text{Idsat}) * m + \text{offset, for first order.}$$

and $$Q'(\text{Idsat}) = Q(\text{Idsat})^2 * s + Q(\text{Idsat}) * m + \text{offset},$$

for second order.

In the expressions above, the calibrated output Q' is adjusted for inaccuracies in the bandgap voltage reference up to second order by using a digital multiplier and an adder. The offset and multiplier are constants that may be developed by circuit simulation tools, or, from analysis of objective measurements taken on test circuits, for example.

The particular calibration algorithm used is a design choice and may be tailored to the particular application. An advantage of the exemplary embodiments described herein is that the circuit calibration is performed purely in the digital domain, may be performed in an off chip circuit or in software, and is performed without the need for tuning or trimming of on chip components or added circuitry. For example, the algorithm may be performed on data returned as digital signals from a scribe line or integrated circuit, and may be done off-line at a later time, or performed while other measurements are underway, to make testing as efficient and flexible as possible.

Figure 8:
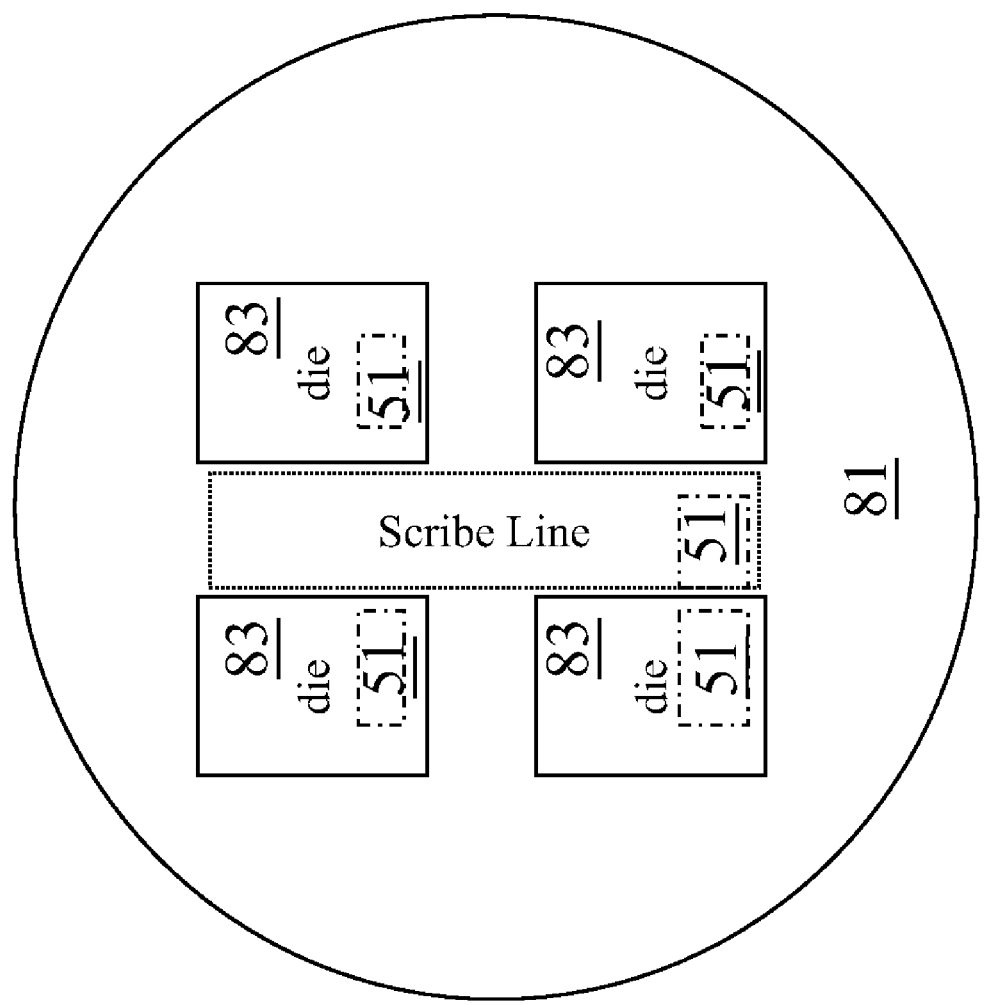
FIG. 8 illustrates in a simple view a semiconductor wafer incorporating one of the embodiments of the present invention.

FIG. 8 illustrates an exemplary semiconductor wafer incorporating one or more process monitor circuit embodiments of the present invention. In FIG. 8, a semiconductor wafer 81 is shown prior to singulation but after devices are completely formed as integrated circuit dies 83. A process monitor circuit 51 as shown above in FIG. 5, for example, is placed either in the scribe line area, on board each die as a macro element, or in both places. If the scribe line approach is used, the process monitor circuits may be placed in multiple locations on the wafer. If the scribe line area is used, additional probe pads may be provided to enable test equipment to receive the digital outputs of the process monitor circuitry.

Figure 9:
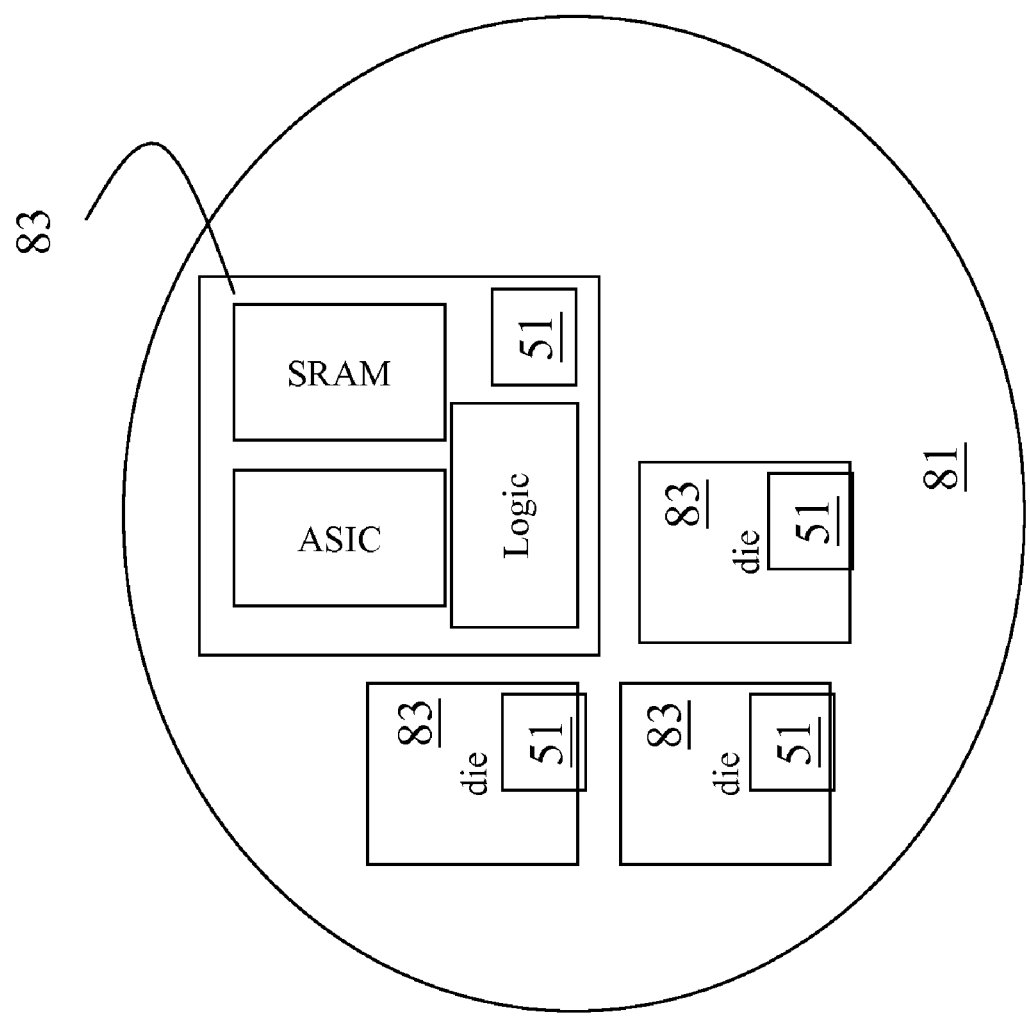
FIG. 9 illustrates in another view an integrated circuit on a semiconductor wafer incorporating one of the embodiments of the present invention.

FIG. 9 depicts semiconductor wafer 81 with an alternative arrangement. In FIG. 9, one integrated circuit die is detailed in a block diagram view showing the use of ASIC logic, logic circuitry, an embedded SRAM, and the process monitor which in this exemplary embodiment is a process monitor macro 51 on board the integrated circuit. The remaining integrated circuit dies 83 likewise comprise process monitor macros 51. The process monitor macros may be addressed by logic and the digital outputs made available at test pins, probe pads, or through scan path outputs as is known in the testing art.

The embodiments described above provide circuitry for measuring and outputting signals for particular characteristics, e.g. Vtn, Idsat, and temperature. However, by combining and sharing certain circuit elements, it is also possible to output a signal proportional to the combination of these characteristics, which may also be convenient and useful. This additional feature requires no added circuitry and is an alternative embodiment to the above described circuits.

The various embodiments of the process monitor circuit and methods described above may be advantageously applied to any semiconductor process. Particular benefits are seen for advanced semiconductor processes such as 45 nanometer minimum feature size, and below, including 32 and 28 nanometer nodes. However, these exemplary embodiments are not limiting and the use of the process monitor circuits and methods will be advantageous for any semiconductor process technology.

Although the present invention and its advantages have been described in detail, it should be understood that various changes, substitutions and alterations can be made herein without departing from the spirit and scope of the invention as defined by the appended claims. For example, it will be readily understood by those skilled in the art that the methods may be varied while remaining within the scope of the present invention.

Moreover, the scope of the present application is not intended to be limited to the particular embodiments of the methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. A device under test circuit comprising:
    a first node for receiving a first voltage that is one selected from a group consisting essentially of a voltage supply and a voltage resulting from applying a current that is temperature independent to a first order to a transistor;
    a second node for receiving a second voltage corresponding to a circuit parameter;
    a comparator for providing an output current corresponding to a comparison of the voltages at the first and second nodes; and
    a voltage to time converter to output a periodic signal corresponding to the circuit parameter and further comprising a sampling register receiving the periodic signal and receiving a time varying clock signal related to a reference voltage;
    wherein the circuit parameter is one selected from the group consisting essentially of a transistor threshold voltage and a transistor saturation current.

2. The device under test circuit of claim 1, further comprising a circuit coupled to convert the output current to an output voltage.

3. The device under test circuit of claim 1, further comprising a bandgap reference circuit for supplying the first voltage.

4. The device under test circuit of claim 1, further comprising a transistor with a characteristic threshold voltage for providing the second voltage to the comparator, and the circuit parameter is the threshold voltage.

5. The device under test circuit of claim 1, wherein the converter further comprises a counter that clocks the output of the sampling register to form a digital signal corresponding to the circuit parameter.

6. The device under test circuit of claim 5, further comprising a calibration circuit coupled to calibrate the digital output signal using a digital algorithm.

7. The device under test circuit of claim 6, wherein the calibration circuit is a digital filter.

8. The device under test circuit of claim 1, wherein the device under test circuit is disposed in a scribe line area of a semiconductor wafer.

9. The device under test circuit of claim 1, further comprising selection circuitry to select the circuit parameter from the circuit parameters Vtn and Idsat.

10. An integrated circuit, comprising:
    logic circuitry for a defined function; and
    a test macro circuit, comprising:
        a first circuit element receiving the first current for providing a predetermined voltage at a first node, the first voltage being one selected from a group of a voltage supply and a voltage resulting from the application of a current that is independent of temperature to a first order to a transistor;
        a second circuit for providing a voltage corresponding to a circuit parameter to a second node;
        a comparator for providing an output current corresponding to a comparison of the voltages at the first and second nodes; and
        a voltage to time converter outputting a periodic signal corresponding to the output current, and further comprising a sampling register receiving the periodic signal and receiving a time varying clock signal related to a reference voltage;
    wherein the circuit parameter is one selected from the group consisting essentially of a transistor threshold voltage and a transistor saturation current.

11. The integrated circuit of claim 10, wherein the logic circuitry further comprises a memory portion.

12. The integrated circuit of claim 10, wherein the logic circuitry further comprises an ASIC portion.

13. The integrated circuit of claim 10, further comprising a probe pad coupled to the output signal.

14. The integrated circuit of claim 10, further comprising test output circuitry coupled to output a digital signal from the output signal.

15. A semiconductor wafer process monitor circuit, comprising:
    a plurality of integrated circuit dies fabricated on the semiconductor wafer;
    a scribe line area formed apart from the integrated circuit dies;
    at least one device under test circuit, comprising:
        a first circuit element for providing a predetermined voltage at a first node wherein the first voltage is one selected from the group consisting essentially of a fixed voltage supply and a voltage resulting from the application of a current that is temperature independent to a first order to a transistor;

a second circuit element for providing a voltage corresponding to a circuit parameter to a second node;

a comparator for providing an output current corresponding to a comparison of the voltages at the first and second nodes; and a voltage to time converter outputting a periodic signal corresponding to the output current, and further comprising a sampling register receiving the periodic signal and receiving a time varying clock signal related to a reference voltage;

wherein the circuit parameter is one selected from the group consisting essentially of transistor threshold voltages and a transistor saturation current.

16. The semiconductor wafer of claim 15, wherein the device under test circuit is located in an area selected from the scribe line area and at least one of the plurality of integrated circuit dies.

17. A device under test circuit comprising:

a first node for receiving a first voltage that is temperature independent to a first order;

a second node for receiving a second voltage corresponding to a circuit parameter;

a comparator for providing an output current corresponding to a comparison of the voltages at the first and second nodes;

wherein the circuit parameter is a quantity proportional to temperature; and a voltage to time converter to output a periodic signal corresponding to the circuit parameter, further comprising a sampling register receiving the periodic signal and receiving a time varying clock signal related to a reference voltage.

18. The device under test circuit of claim 17 wherein the circuit further comprises a resistor having a value with a thermal dependency, a diode device, and the circuit parameter is the absolute temperature.

19. The device under test circuit of claim 18, wherein the converter further comprises a counter that clocks the output of the sampling register to form a digital signal corresponding to the circuit parameter.

20. The device under test circuit of claim 19, further comprising a calibration circuit coupled to calibrate the digital output signal using a digital algorithm.

21. The device under test circuit of claim 20, wherein the calibration circuit is a digital filter.

22. The device under test circuit of claim 17, wherein the device under test circuit is disposed in a scribe line area of a semiconductor wafer.

* * * * *

UNITED STATES PATENT AND TRADEMARK OFFICE
CERTIFICATE OF CORRECTION

| | | |
|---|---|---|
| PATENT NO. | : 8,183,910 B2 | Page 1 of 3 |
| APPLICATION NO. | : 12/495024 | |
| DATED | : May 22, 2012 | |
| INVENTOR(S) | : Chung et al. | |

It is certified that error appears in the above-identified patent and that said Letters Patent is hereby corrected as shown below:

Delete the title page and substitute therefore with the figure 2 attached consisting of the corrected Illustrative figure(s).

On the title page, item (75) Inventors, line 2, delete "Cranberry, NJ (US)" and insert --Cranbury, NJ (US)--.

In the Drawings

Sheet 1, Figure 1, delete current figure and replace with:

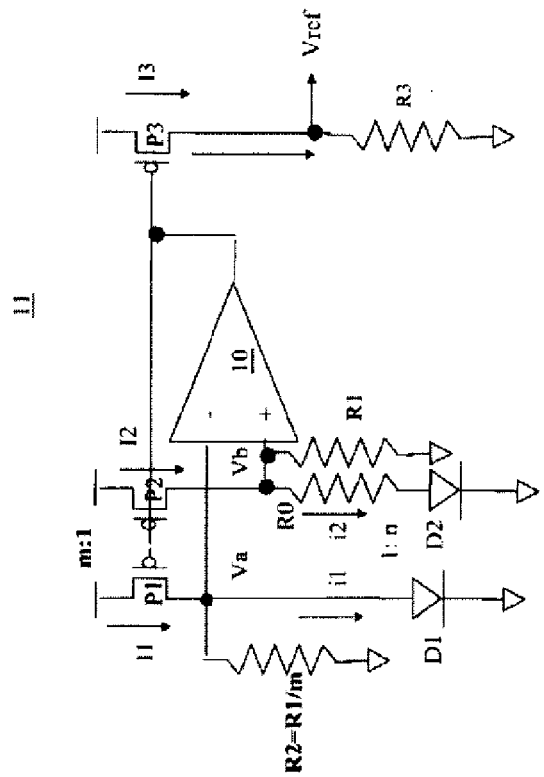

Signed and Sealed this
Ninth Day of September, 2014

Michelle K. Lee
*Deputy Director of the United States Patent and Trademark Office*

CERTIFICATE OF CORRECTION (continued)
U.S. Pat. No. 8,183,910 B2

Sheet 2, Figure 2, delete current figure and replace with:

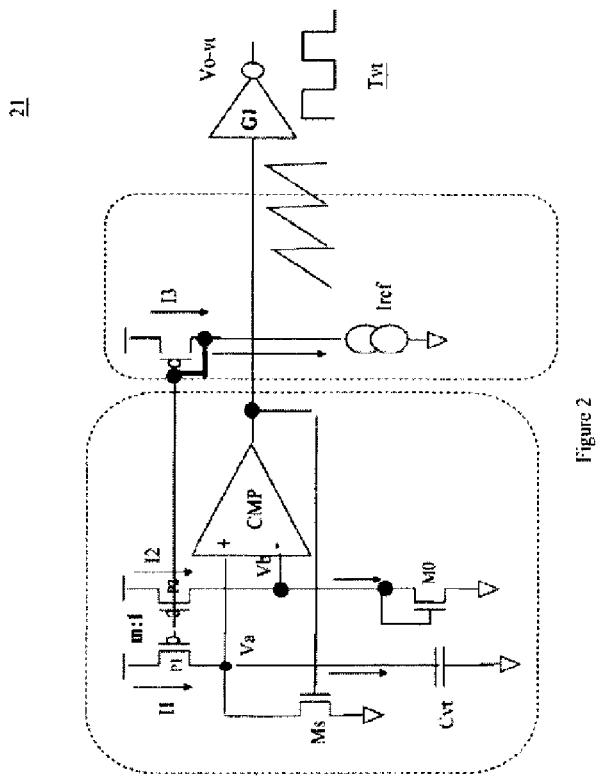

Figure 2

Sheet 4, Figure 4, delete current figure and replace with:

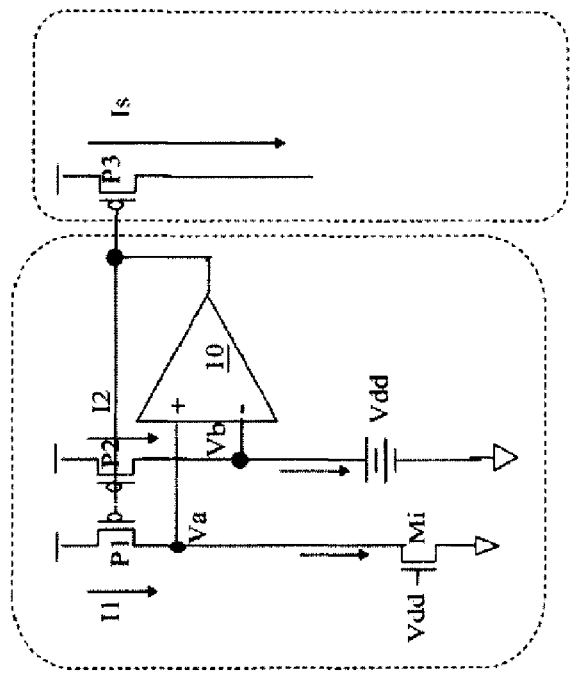

Figure 4

CERTIFICATE OF CORRECTION (continued)
U.S. Pat. No. 8,183,910 B2

Sheet 5, Figure 5, delete current figure and replace with:

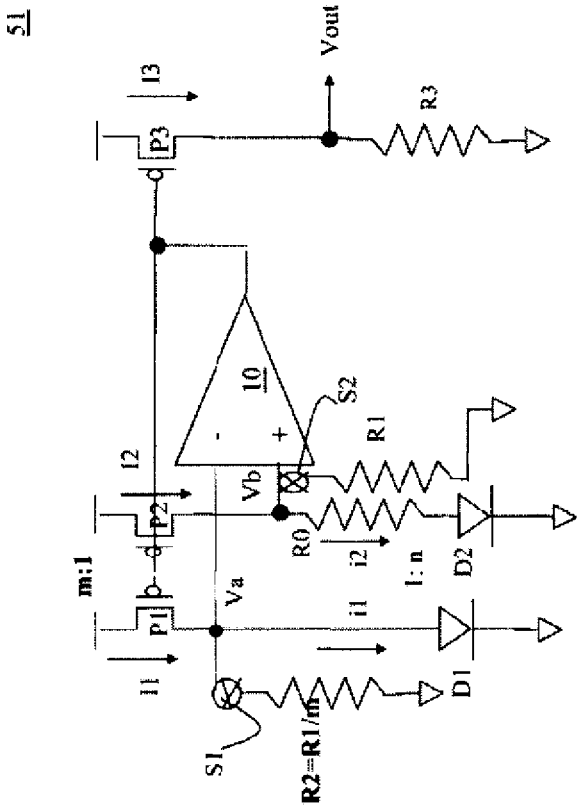

Figure 5

Sheet 6, Figure 6, delete current figure and replace with:

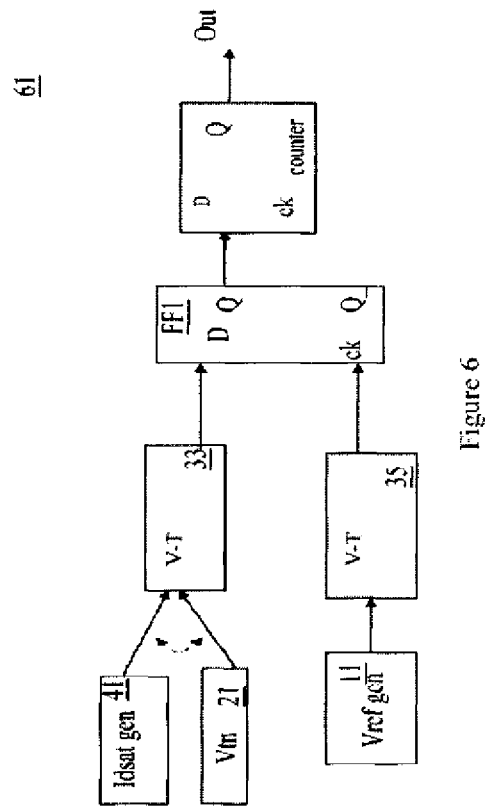

Figure 6